United States Patent

Wong et al.

[11] Patent Number: 5,891,253
[45] Date of Patent: *Apr. 6, 1999

[54] CORROSION RESISTANT APPARATUS

[75] Inventors: Manus K. Wong; Sandy M. Chew, both of San Jose, Calif.

[73] Assignee: Applied Materials, Inc., Santa Clara, Calif.

[*] Notice: The term of this patent shall not extend beyond the expiration date of Pat. No. 5,522,932.

[21] Appl. No.: 542,367

[22] Filed: Oct. 12, 1995

Related U.S. Application Data

[63] Continuation-in-part of Ser. No. 62,979, May 14, 1993, Pat. No. 5,522,932.

[51] Int. Cl.[6] .................................................. C23C 16/00
[52] U.S. Cl. .......................................................... 118/726
[58] Field of Search ........................................ 118/715, 726

[56] References Cited

U.S. PATENT DOCUMENTS

| | | | |
|---|---|---|---|
| 2,577,365 | 12/1951 | Reid | 205/264 |
| 3,578,943 | 5/1971 | Schoumaker | 219/121 |
| 3,708,418 | 1/1973 | Quinn | 204/298 |
| 3,717,504 | 2/1973 | Aonuma et al. | 428/670 |
| 3,729,396 | 4/1973 | Browning et al. | 205/264 |
| 3,767,369 | 10/1973 | Barlow et al. | 29/194 |
| 3,823,685 | 7/1974 | Koepp et al. | 118/49 |
| 3,902,978 | 9/1975 | Zilske et al. | 205/264 |
| 4,238,551 | 12/1980 | Lal et al. | 428/660 |
| 4,416,742 | 11/1983 | Kinase et al. | 205/264 |
| 4,486,513 | 12/1984 | Mashiko et al. | 428/670 |
| 4,579,080 | 4/1986 | Martin et al. | 118/500 |
| 4,910,041 | 3/1990 | Yanagihara et al. | 427/37 |
| 4,948,492 | 8/1990 | Niedrach et al. | 204/435 |
| 5,062,508 | 11/1991 | Ackermann et al. | 118/723 |
| 5,091,207 | 2/1992 | Tanaka | 118/715 |
| 5,366,585 | 11/1994 | Robertson et al. | 156/643 |
| 5,433,832 | 7/1995 | Rich et al. | 204/164 |
| 5,522,932 | 6/1996 | Wong et al. | 118/715 |

FOREIGN PATENT DOCUMENTS

| | | | |
|---|---|---|---|
| 1922421 | 11/1970 | Germany | 205/264 |
| 4925531 | 7/1974 | Japan | 205/264 |
| 856867 | 12/1960 | United Kingdom | 205/264 |
| 859806 | 1/1961 | United Kingdom | 205/264 |

OTHER PUBLICATIONS

Lowenheim, Frederick A., "Modern Electroplating," *The Electrochemical Society Inc.,* New York, NY, 1942, pp. 312–314, 657.

Parker, Edward A., "Electrodeposition of Rhodium," *Plating,* Jul. 1955, pp. 882–892.

Schumpelt, K., "Electrodeposition of the Metals of the Platinum Group," *The Electrochemical Society,* Paper 80–40, Oct. 1941, pp. 449–558.

*Primary Examiner*—Brian Dutton
*Attorney, Agent, or Firm*—Janah & Associates

[57] ABSTRACT

An apparatus used for processing substrates in a corrosive process gas is rendered substantially resistant to corrosion, by coating processing components exposed to the corrosive process gas with a coating comprising rhodium. The rhodium coating can be deposited by electroplating, and preferably has a thickness of at least about 10 microinches. A coating of nickel can be also applied between the rhodium coating and the processing component.

28 Claims, 2 Drawing Sheets

CORROSION RESISTANT APPARATUS

CROSS-REFERENCE

This application is a continuation-in-part of U.S. patent application Ser. No. 08/062,979 filed on May 14, 1993 now U.S. Pat. No. 5,522,932, the disclosure of which is incorporated herein by reference.

BACKGROUND

This invention relates to a corrosion resistant apparatus for processing substrates, and in particular, for processing semiconductor wafers.

In many types of manufacturing processes, substrates are processed in process chambers containing corrosive process environments. For example, in semiconductor fabrication processes, corrosive process gases are used to deposit material upon, etch, or clean semiconductor wafers. Semiconductor processes are typically carried out in an enclosed process chamber containing metallic, ceramic, glass and polymer components. Metal components are fabricated from metal alloys such as stainless steel, aluminum, "INCONEL," "HAYNES," and "HASTALLOY," and are typically used for loading and positioning substrates into the chamber, for chamber walls, and for controlling process gas flow into and out of the chamber. Ceramic components such as quartz guards and high temperature components are generally used to contain the corrosive process gases or plasma in the chamber. The components in the process chamber often corrode in corrosive process gas, particularly in reactive halogen gases and plasmas thereof. For example, a plasma of nitrogen trifluoride (which is used to clean process chambers), contains reactive fluorine species that readily corrode metal components.

Corrosion of the components within the process chamber by the corrosive process environment limits the life of the processing apparatus, thereby increasing the down time of the apparatus and substrate processing cost. Also, corroded components can flake off and form contaminant particles which can deposit on the substrate. It is difficult to non-destructively detect such contamination during the initial stages of processing the wafer. Thus, it is only in the final stages of the manufacturing process, when the fully processed semiconductor wafers are worth between $50,000 to $100,000 each, that the contaminant deposits are discovered, and the entire wafer is rejected.

Thus, there is a need for a corrosion resistant apparatus and processing components that resist corrosion when exposed to corrosive process environments, and which form reduced amounts of contaminant particles resulting from corrosion.

SUMMARY

The present invention satisfies these needs by providing an corrosion resistant apparatus that is useful for processing substrates in a corrosive process environments. The corrosion resistant apparatus can comprises a process chamber with surrounding chamber walls and at least one processing component in the chamber. At least a portion of the processing component in the chamber is exposed to the corrosive processing environment and has a corrosion resistant coating comprising rhodium. The thickness of the corrosion resistant coating is at least about 10 microinches, and more preferably is from about 10 to about 100 microinches. A coating of nickel, preferably from about 200 to about 600 microinches thick, can be applied between the rhodium coating and the processing component.

The processing component of the corrosion resistant apparatus can be any of the following components: (i) process chamber walls; (ii) support components for supporting a substrate in the process chamber; (iii) positioning components for positioning a substrate in the chamber, (iv) gas inlet components for introducing a process gas into the chamber, (v) gas exhaust components for exhausting gases from the chamber, (vi) plasma forming or generating components for generating a plasma from the process gas, or (vii) fastener components for fastening the other components to one another, or to the process chamber walls. At least one of the processing components exposed to the corrosive process gas in the process chamber is coated with the corrosion resistant coating.

The apparatus is used to process substrates by introducing a process gas into a process chamber containing the substrate, and setting process conditions suitable for processing the substrate. The process conditions can be set (i) for depositing material on the substrate, such as by chemical vapor deposition processes, (ii) for etching the substrate, or (iii) for cleaning contaminant deposits deposited on the substrate, chamber walls, and processing components.

DRAWINGS

These and other features, aspects, and advantages of the present invention will become better understood with regard to the following description, appended claims, and accompanying drawings which illustrate examples of the invention, where:

DESCRIPTION

The present invention provides a corrosion resistant apparatus for processing substrates in a corrosive environment, such as reactive gaseous environment. The corrosion resistance is achieved by coating components of the apparatus that are exposed to the corrosive environment with a coating comprising rhodium.

Figure 1:
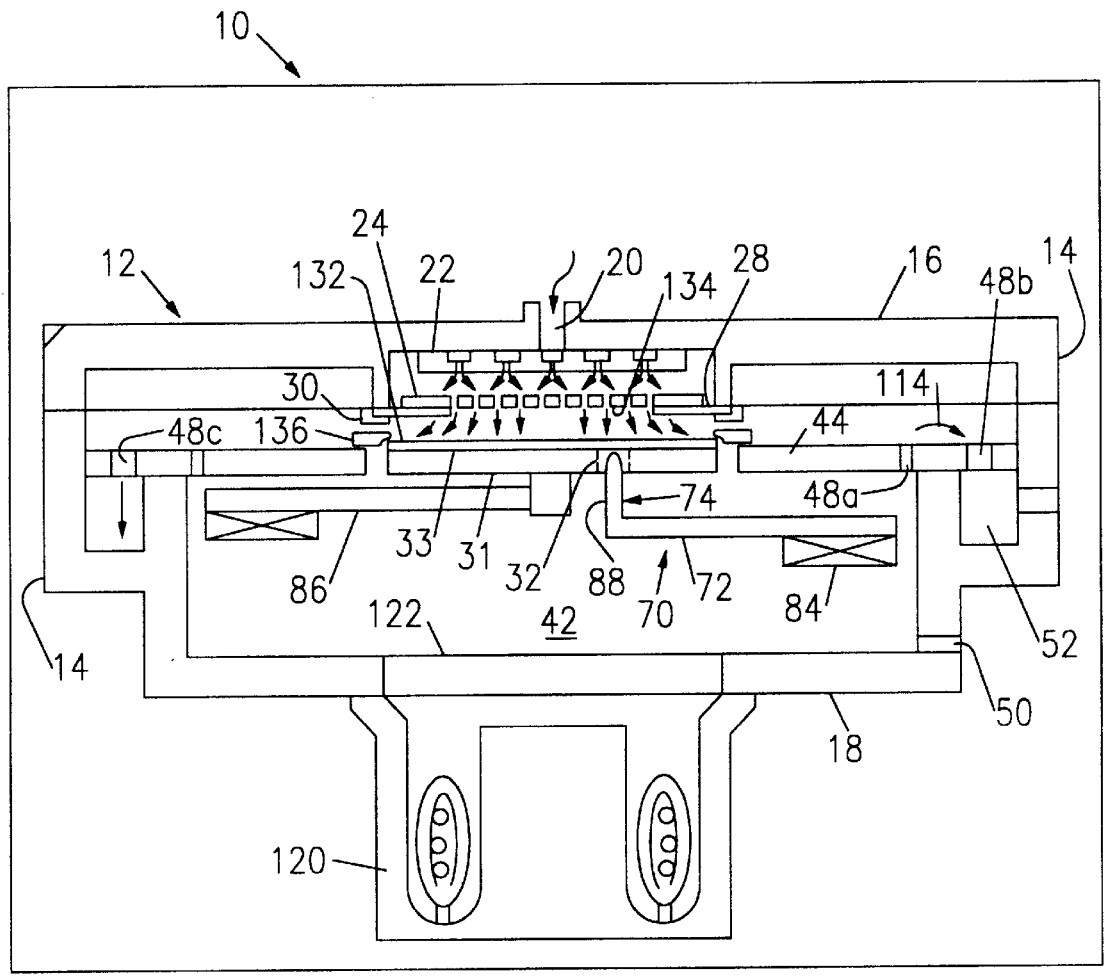
FIG. 1 is a schematic, in partial vertical cross-section, of an apparatus according to the present invention suitable for processing a semiconductor substrate.

A schematic of an exemplary processing apparatus 10 suitable for illustrating use of the present invention is shown in FIG. 1. The particular embodiment of the processing apparatus 10 shown herein, suitable for processing of planer substrates, such as semiconductor substrates, is provided only to illustrate the invention and should not be used to limit the scope of the invention. For example, the corrosion resistant coating of the present invention can be used to prevent corrosion of any structure in any corrosive environment, and can be used for manufacturing processes other than semiconductor fabrication.

The processing apparatus 10 generally comprises an enclosed process chamber 12 having surrounding chamber walls that include sidewalls 14, a top wall 16, and a bottom wall 18. The process chamber 12 is generally made of aluminum. Process gas which can be used to deposit material on a substrate, etch the substrate, or clean the process chamber is introduced into the chamber 12 through the process gas inlet 20. Thereafter, the process gas passes through a perforated blocker plate 22 and "showerhead"

diffuser 24 to distribute the process gas in the chamber 12. The blocker plate 22 and the showerhead 24 are fastened to the chamber top wall 16 by fasteners such as screws 26. A ceramic shield ring 28 is detachably clamped over the diffuser 24, and to the top wall 16 by rotable clamps 30.

Within the chamber 12 is located a moveable support plate 31 having a plurality of holes 32a, 32b therethrough. A planar substrate 33, such as a silicon or gallium arsenide wafer, is introduced into the process chamber 12 through a wafer load inlet 34 in the side wall 14 of the chamber 12 to rest upon the support plate 31. The support plate 31 can be lifted or lowered so that the gap between the substrate 33 and the showerhead 24 can be adjusted for optimal process efficacy. The support plate 31 has a mounting arm 35 extending thereof. The mounting arm 35 is fastened to a support lift bellows 36 by a bracket 37, a nut plate 38, and screw assemblies 39a, 39b, 39c. The support lift bellows 36 provides a mechanism for lifting and lowering the support plate 31.

The interior volume of the chamber 12 is divided into a region 40 above, and a region 42 below, a horizontal perforated barrier plate 44. The perforated barrier plate 44 has exhaust holes 48a, 48b, 48c which are in fluid communication with vacuum manifolds 50 and 52, to withdraw spent process gas and gaseous byproducts from the regions 40 and 42, as shown by the arrow 114 in FIG. 1.

A wafer lift finger assembly 70 is used to lift and lower the substrate 33 onto the support plate 31. A suitable lift finger assembly 70 comprises a C-shaped ceramic ring 72 bearing four ceramic lift fingers 74 which extend radially toward the center of the C-shaped ring. The lift fingers 74 are fastened to the C-shaped ring 72 by fasteners comprising lift finger clamps 76 which are screwed over the lift fingers 74 and into the C-shape ring 72, using headless set screws 78a, 78b, a top screw assembly 80 and a bottom screw assembly 82. The C-shaped ring 72 is attached to a finger lift bellows 84 by a mount 86. The lift fingers 74 have prongs 88, which can extend through the holes 32a, 32b of the support plate 31, to contact the substrate 33. The lift bellows 84 lifts and lowers the lift finger assembly 70.

A heater module 120 can be located below the support plate 31, and underneath a quartz window 122. The heater module 120 can provide radiant energy for heating the substrate 33 for thermally activated processes, such as chemical vapor deposition processes.

A gas containment ring or plasma focus ring (not shown) can be used to contain the flow of process gas, or plasma, around the substrate 33. Suitable gas containment rings are typically made of materials resistant to corrosion by corrosive process gas, such as metals, for example aluminum. Suitable plasma containment rings are typically made of materials resistant to corrosion by a plasma, such as ceramic materials, for example aluminum oxide or quartz.

Any of the processing components in the chamber 12 or portions of the process chamber walls that are exposed to the corrosive processing environment are candidates for the corrosion resistant coating 124, and in particular, the portions of the chamber walls or components exposed to corrosive process gases at temperatures in excess of about 200° C. which are generally subject to more severe corrosion. The temperature of the processing component is estimated from the temperature of the support plate 31 that is measured using a thermocouple located in the support plate 31.

The processing components in the process chamber 12 can be made from a variety of materials including metals, ceramics, glasses, polymers and composite materials. Suitable metals that are used to fabricate the processing components and that have been successfully coated with the corrosion resistant coating, include "HAYNES 242," "Al-6061," "SS 304," "SS 316," and INCONEL. Although the ceramic components within the chamber can be coated, generally, it is not necessary to coat the ceramic components because these components are substantially more resistant to corrosion than metal components. For the same reasons, it is also generally not necessary to coat the anodized aluminum components, which are protected by a coating of anodized aluminum. However, it can be necessary to coat these components in certain corrosive process gas environments, such as for example when a plasma is formed from process gas that is reactive with ceramic materials.

For the exemplary process chamber and processing components described to illustrate the invention, the processing components that would be typically coated with the corrosion resistant coating are described in Table I.

TABLE I

| COMPONENT | REFERENCE NO. |
|---|---|
| Blocker Plate | 22 |
| Showerhead Diffuser | 24 |
| Screws | 26 |
| Rotably Mounted Clamps | 30 |
| Support Lift Bellows | 36 |
| Nut Plate | 38 |
| Screw Assembly | 39a, 39b, 39c |
| Lift Finger Clamp | 76 |
| Headless Screws | 78a, 78b |
| Bottom Screw Assembly | 82 |
| Wafer Lift Bellows | 84 |

Figure 3:
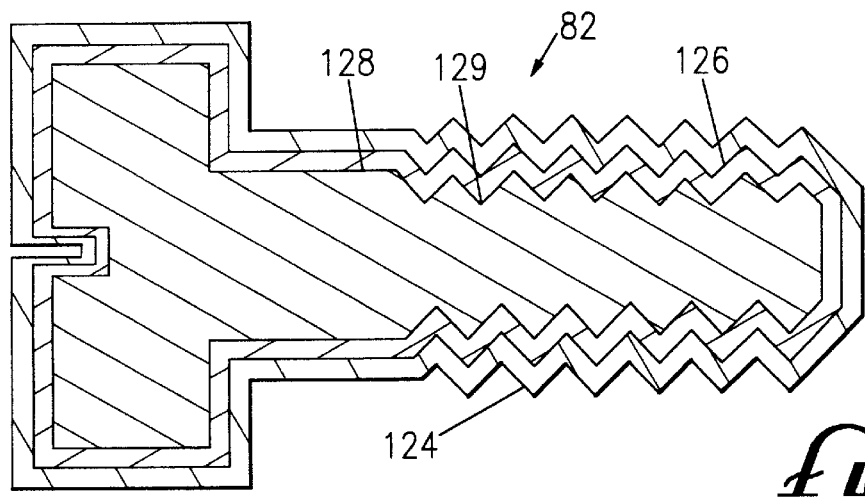
FIG. 3 is a side sectional view of an exemplary corrosion resistant coated component of the present invention.
Figure 2:
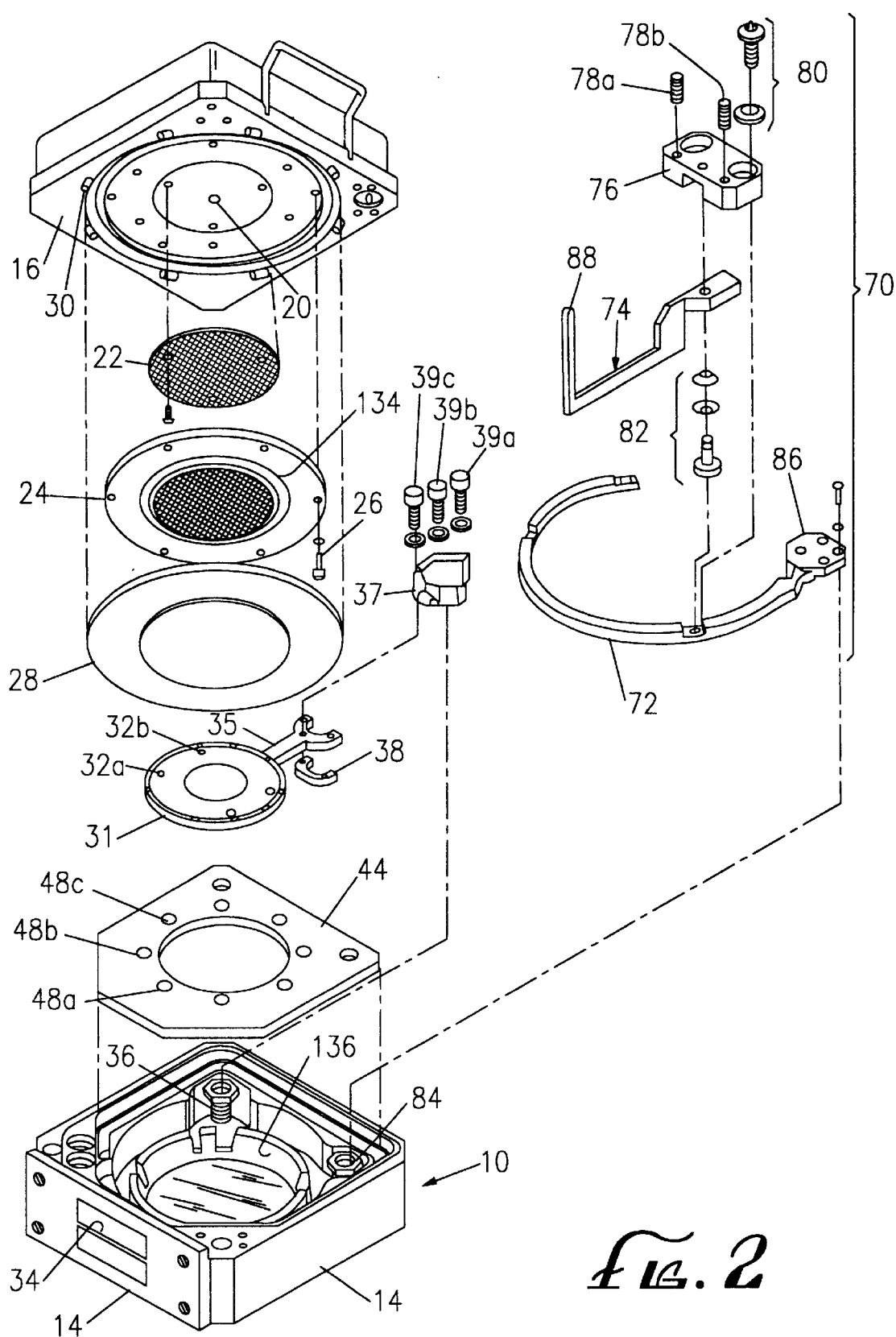
FIG. 2 is an exploded perspective view of the apparatus of FIG. 1, showing processing components within the apparatus.

For example, as shown in FIG. 3, the coated screw 82 preferably has a corrosion resistant rhodium coating 124 with a thickness of at least about 10 microinches (i.e., $10 \times 10^{-6}$ inches or $2.54 \times 10^{-5}$ cms), more preferably from about 10 to about 100 microinches ($2.54 \times 10^{-5}$ to $25.4 \times 10^{-5}$ cms), most preferably from about 20 to 60 microinches ($5.08 \times 10^{-5}$ to $15.24 \times 10^{-5}$ cms), and optimally about 40 microinches ($10.16 \times 10^{-5}$ cms). More preferably, the corrosion resistant coating has a coating of nickel 126 between the corrosion resistant coating 124 and the surface 128 of the processing component 82. The nickel layer 126 is sufficiently thick to allow the rhodium coating 124 to firmly adhere to the component 82. Preferably the thickness of the nickel coating 126 is from about 200 to about 600 microinches ($5.08 \times 10^{-4}$ to $15.24 \times 10^{-4}$ cms), and more preferably about 400 microinches ($10.16 \times 10^{-4}$ cms).

The process used for coating the metal components with the rhodium 124, or the combination nickel 126 and rhodium 124 coating, can be any conventional coating processes, including for example, electroplating, sputtering, immersion coating or chemical vapor deposition.

Electroplating is a preferred method of coating processing components that are electrically conductive. In the electroplating process, a electrolyte solution containing rhodium or nickel metal ions is subjected to a low voltage current between an anode and a cathode. The processing component to be coated forms the cathode and the anode is made of a conductive material such as platinum, titanium-rhodium alloy, titanium-platinum alloy or stainless steel. Conventional electroplating processes and solutions are described in *Modern Electroplating*, edited by F. Lowenheim, 2d Ed., John Wiley & Sons (1963). Vendors used to electroplate the components of the present invention include ACTERON, of Redwood City, Calif., and HAMMON PLATING, of Palo Alto, Calif.

In order to ensure good adhesion of the electroplated coating to the processing component, the surface of the component must be thoroughly cleaned from oxide scale and/or grease, prior to electroplating. This cleaning can be carried out by agitating the component in a solution of dilute hydrochloric acid, or sulfuric acid, or in a degreasing solvent.

The rhodium electroplating can be carried out by immersing the component into an electrolyte solution containing from about 1 to about 100 grams/liter of a rhodium salt such as rhodium sulfate, rhodium sulfamate, and/or rhodium phosphate. The bath can also contain other additives for improving conductivity or for buffering the solution. For example, sulfuric acid can be added to improve the conductivity of the solution in quantities ranging from 1 to 100 ml/liter of solution. The exact pH and temperature of the bath may be adopted according to such conditions that are applicable for conventional electroplating.

The optional nickel plating can be carried out using a solution of nickel sulfate, nickel sulfamate, nickel chloride, nickel phosphate, or nickel fluoroborate or combinations thereof. The solution can also include acids such as hydrofluoric acid, hydrochloric acid, or boric acid, and wetting agents, such as sodium lauryl sulphate or sodium lauryl ethyl sulfate.

A more uniform coating is obtained when the rhodium or nickel plating electroplating solution is agitated. The amount of agitation necessary depends on the complexity of the geometry of the component to be coated. Greater agitation is required to uniformly coat components with small features or crevices, such as the crevices 129 of the screw 82 or the perforations of the showerhead 24. Since the coating is provided to protect the component against corrosion, it is important to obtain a uniform and complete coverage of the component with the corrosion-resistant coating.

It is also important that the electroplating bath not be contaminated with other metal salts, which could cause deposition of contaminant metals on the components. These contaminant metals subsequently vaporize on exposure to high temperatures and deposit on the wafer, thereby contaminating the wafer and reducing the yield of the process.

The apparatus is used to process substrates by introducing a process gas into the chamber, and setting process conditions suitable for processing the substrate. After process gas is introduced in the chamber, the process conditions within the chamber are set to deposit material on the substrate such as by chemical vapor deposition, or to etch material from the substrate, or for cleaning contaminant deposits deposited on the substrate, chamber walls and processing components.

Typical chemical vapor deposition (CVD) processes for depositing dielectric and polysilicon films on a substrate, use (i) process gases such silicon source gas for example $SiH_4$ or $SiCl_2H_2$, and an oxygen source gas such as $CO_2$ and $H_2$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, HCl, $PH_3$ and $SiH_4$. CVD processes can be also used to deposit refractory metals such as molybdenum silicide, tantalum silicide, and tungsten silicide, as generally described in *VLSI Technology, Second Edition,* Chapter 9, by S. M. Sze, McGraw-Hill Publishing Company (1988), which is incorporated herein by reference.

The apparatus can also be used to etch material from the substrate. Conventional metal interconnect etching processes use halogen containing gases such as $BCl_3$, $Cl_2$, $SF_6$, $CF_4$, $CFCl_3$, $CF_2Cl_2$, $CF_3Cl$, $CHF_3$, and $C_2ClF_5$, HF, $SiCL_4$, $NF_3$, $F_2$, and $CCl_4$. Resist etching processes typically use oxygen gas to etch the polymeric resist on the substrate.

The apparatus can also be used for processing the substrates in plasmas which are used to deposit material, etch or clean substrates. A typical plasma etching processes uses a plasma of chlorine, oxygen, or $SiCl_4$, to etch the conductive layer, as generally described in *VLSI Technology, Second Edition,* Chapter 5, by S. M. Sze, McGraw-Hill Publishing Company (1988), which is incorporated herein by reference. Another example is the use of plasma in reactive ion-etching processes to etch through metallic layers on substrates, as for example, described in U.S. Pat. No. 4,190,488, to Winters, which is incorporated herein by this reference. Plasma processes that use $NF_3$ to clean substrates are generally described in U.S. Pat. No. 5,201,990, to Chang, et al., which is incorporated herein by reference. Plasmas are also used for depositing coatings on the substrate, as in plasma-enhanced chemical vapor deposition (CVD) processes, as generally described in U.S. Pat. No. 5,093,150, to Somero, et al., and U.S. Pat. No. 4,969,415, to Bartha, et al., both of which are incorporated herein by reference.

The following examples are provided to illustrate use of a corrosion resistant apparatus and processing components of the present invention for processing of semiconductor substrates. However, the corrosion resistant coating of the present invention can be used in other applications as would be apparent to those skilled in the art. Thus, the scope of the present invention should not be restricted to the illustrative examples provided herein.

EXAMPLES 1–3

Plasma Cleaning Process

A chemical vapor deposition (CVD) process was used to deposit a coating onto a semiconductor substrate using the apparatus 10. After typically from about 1 to about 100, and more typically from about 5 to 75 deposition process cycles, a plasma process is used to clean the process chamber 12, the process components, and the backside of the substrate, to remove residual CVD deposits therefrom. To clean the backside of the wafer 33, the prongs 88 of the lift fingers 74 are extended through the holes 32a, 32b of the support plate 31 to lift the wafer 33 off the support plate 31 until the front face 132 of the wafer 33 is pressed against the surface 134 of the showerhead diffuser plate 24. Thereafter, a reactive "cleaning" gas such as nitrogen tri-fluoride ($NF_3$) is introduced into the chamber. A plasma is generated from the gas, by positively charging the top wall 16, the blocker plate 22, and the showerhead 24, and by simultaneously grounding the barrier plate 44 and chamber walls 136. The RF-generated plasma is maintained at a power level of about 10 to 1000 watts, for about 5 to about 80 seconds, and preferably for about 20 to about 40 seconds, for every sequential CVD deposition cycle carried out before cleaning. Thus, for example, if the plasma cleaning process is carried out for about 75 CVD deposition process cycles, the cleaning plasma is activated for about 600 to about 1000 seconds to substantially clean the deposit in the chamber. The plasma activated gas reacts with the deposits on the wafer 33, chamber walls 136, and components, to form gaseous compounds which are exhausted from the chamber, thereby substantially cleansing the chamber of deposits. Residual fluorine ions in the chamber are passivated using a reactive hydrogen containing gas, such as hydrogen.

Example 1

A test was run comparing the corrosion performance of coated and uncoated components in a corrosive gaseous plasma environment. One of the screws 39a, 39b, 39c (made from "HAYNES 242" alloy) was left uncoated, and the other screws 39a, 39b, 39c as well as the bottom clamp 38 were coated with rhodium. The uncoated screws were cleaned with a 1:1 ratio NH$_4$OH: Hydrogen Peroxide solution prior to the plasma processing. After sequentially cleaning about 25 wafers by plasma, it was found that the uncoated screws 39a, 39b, 39c were corroded and discolored, and the screws 39a, 39b, 39c coated with rhodium were not corroded.

Example 2

This experiment was run to determine if the corrosion resistant rhodium coating vaporizes and contaminates wafers when exposed to high temperatures. A variety of rhodium plated coated components including small rectangular metal plates, "Al-6061" bushings, "INCONEL" washers, and "SS 304" lift finger components were placed on a silicon wafer and thermally cycled to 475° C. X-ray fluorescence was then used to determine if the areas of the silicon wafer in contact with the coated components were contaminated with rhodium. No rhodium was found in the contact areas of the silicon wafer, indicating that the rhodium plated coating did not vaporize at these temperatures.

Example 3

In this experiment, a rhodium coating 124 having a thickness of about 40 microinches was electroplated on top of an electroplated nickel coating 126 having a thickness 400 microinches, on each of the following components: (i) the blocker plate 22, (ii) the showerhead diffuser 24, (iii) the screws 26, (iv) the rotably mounted clamps 30, (v) the support lift bellows 36, (vi) nut plate 38, (vii) the screw assemblies 39a, 39b, 39c, (viii) the lift finger clamp 76, (ix) headless set screws 78a, 78b, (x) the bottom screw assembly 82, and (xi) the wafer lift bellows 84. The components were then re-assembled in the apparatus 10.

The apparatus 10 was used to plasma clean, in sequence, about fifty wafers. After cleaning of all 50 wafers, the coated components in the apparatus 10 were visually examined for corrosion. There was little corrosion or discoloration on the rhodium coated components. Also, the regions next to the blocker plate 22, showerhead diffuser 24, and the nut plate 38 did not show any contaminant residue or deposits. However, gray colored residue deposits were observed next to the support lift bellows 36, wafer lift bellows 84 and the lift finger clamps 74.

The present invention has been described in considerable detail with reference to certain preferred versions thereof; however, other versions are possible. For example, the present invention can be used for providing corrosion resistance for a other types of structures and apparatus and is not limited to use for processing of semiconductor wafers. Therefore the spirit and scope of the appended claims should not be limited to the description of the preferred versions contained herein.

What is claimed is:

1. A corrosion resistant apparatus for processing a substrate in a corrosive process gas, the apparatus comprising:
   (a) a process chamber having a process gas inlet for introducing corrosive process gas in the process chamber; and
   (b) at least one metal processing component in the process chamber, at least a portion of the processing component exposed to the corrosive process gas, and having a corrosion resistant coating comprising rhodium.

2. The corrosion resistant apparatus of claim 1, wherein the portion of the processing component having the corrosion resistant coating is made of metal.

3. The corrosion resistant apparatus of claim 1, wherein the processing component comprises a support component for supporting the substrate in the chamber.

4. The corrosion resistant apparatus of claim 1, wherein the processing component comprises a positioning component for positioning the substrate in the chamber.

5. The corrosion resistant apparatus of claim 4, wherein the positioning component comprises at least one of the following:
   (a) a mounting arm for positioning the substrate in the process chamber;
   (b) a lift bellow for lifting and lowering a support plate, the support plate capable of supporting the substrate; or
   (c) a lift finger assembly for lifting and lowering the substrate.

6. The corrosion resistant apparatus of claim 1, wherein the processing component comprises a process gas inlet component for introducing process gas in the process chamber.

7. The corrosion resistant apparatus of claim 6, wherein the process gas inlet component comprises at least one plate having at least one inlet hole for distributing process gas in the process chamber.

8. The corrosion resistant apparatus of claim 1, wherein the processing component comprises a gas exhaust component for exhausting gases from the process chamber.

9. The corrosion resistant apparatus of claim 1, wherein the processing component comprises a plasma forming component for forming a plasma in the process chamber.

10. The corrosion resistant apparatus of claim 1, wherein the processing component comprises a gas flow containment component for containing the flow of corrosive process gas around the substrate in the process chamber.

11. The corrosion resistant apparatus of claim 1, wherein the processing component comprises a fastener component.

12. The corrosion resistant apparatus of claim 1, wherein the thickness of the corrosion-resistant coating on the processing component is at least about 10 microinches.

13. The corrosion resistant apparatus of claim 1, wherein the corrosion-resistant coating on the processing component further comprises nickel.

14. The corrosion resistant apparatus of claim 1, wherein the corrosion-resistant coating on the processing component comprises: (i) a nickel coating on the processing component, and (ii) a rhodium coating on the nickel coating.

15. The corrosion resistant apparatus of claim 14, wherein the thickness of the nickel coating is from about 200 to about 600 microinches.

16. The corrosion resistant apparatus of claim 1, wherein the corrosive process gas is capable of depositing material on the substrate by chemical vapor deposition.

17. The corrosion resistant apparatus of claim 1, wherein the corrosive process gas is capable of etching material from the substrate.

18. The corrosion resistant apparatus of claim 1, wherein the corrosive process gas is capable of cleaning at least one of the following: (i) the substrate, (ii) the process chamber, or (iii) the processing component in the process chamber.

19. A corrosion resistant apparatus for processing a substrate in a corrosive process gas, the apparatus comprising:
   (a) a process chamber having a surrounding wall with at least one process gas inlet in the wall, the process gas inlet provided for introducing corrosive process gas in the process chamber;

(b) at least a portion of the surrounding wall comprising metal and having a corrosion resistant coating comprising rhodium.

20. The corrosion resistant apparatus of claim 19, wherein the thickness of the corrosion-resistant coating is at least about 10 microinches.

21. The corrosion resistant apparatus of claim 19, wherein the corrosion-resistant coating further comprises nickel.

22. The corrosion resistant apparatus of claim 19, wherein the corrosion-resistant coating comprises a nickel coating on the surrounding wall and a rhodium coating on the nickel coating.

23. The corrosion resistant apparatus of claim 22, wherein the thickness of the nickel coating is from about 200 to about 600 microinches.

24. A corrosion resistant apparatus for processing a substrate in a corrosive process gas, the apparatus comprising:

(a) a process chamber capable of containing corrosive process gas; and (b) means for processing the substrate in the process chamber, at least a portion of the means comprising a metal structure exposed to the corrosive process gas and the metal structure having a corrosion resistant coating comprising rhodium.

25. The corrosion resistant apparatus of claim 24, wherein the thickness of the corrosion-resistant coating is at least about 10 microinches.

26. The corrosion resistant apparatus of claim 24, wherein the corrosion-resistant coating further comprises nickel.

27. The corrosion resistant apparatus of claim 24, wherein the corrosion-resistant coating comprises a nickel coating on the metal structure, and a rhodium coating on the nickel coating.

28. The corrosion resistant apparatus of claim 27, wherein the thickness of the nickel coating is from about 200 to about 600 microinches.

* * * * *